United States Patent
Harada et al.

(10) Patent No.: US 7,985,713 B2
(45) Date of Patent: Jul. 26, 2011

(54) SUPERCONDUCTING MAGNESIUM BORIDE THIN-FILM AND PROCESS FOR PRODUCING THE SAME

(75) Inventors: Yoshitomo Harada, Iwate (JP); Masahito Yoshizawa, Iwate (JP); Haruyuki Endo, Iwate (JP)

(73) Assignee: Incorporated National University Iwate University, Morioka-shi (JP)

( * ) Notice: Subject to any disclaimer, the term of this patent is extended or adjusted under 35 U.S.C. 154(b) by 863 days.

(21) Appl. No.: 11/909,512

(22) PCT Filed: Mar. 22, 2006

(86) PCT No.: PCT/JP2006/306397
§ 371 (c)(1),
(2), (4) Date: Sep. 24, 2007

(87) PCT Pub. No.: WO2006/101255
PCT Pub. Date: Sep. 28, 2006

(65) Prior Publication Data
US 2009/0062128 A1    Mar. 5, 2009

(30) Foreign Application Priority Data
Mar. 25, 2005    (JP) .................. 2005-089080

(51) Int. Cl.
*C01B 35/04*    (2006.01)
*C23C 14/24*    (2006.01)
*B05D 3/00*    (2006.01)
*H01L 39/00*    (2006.01)
*H01L 39/24*    (2006.01)
*H01B 13/00*    (2006.01)

(52) U.S. Cl. ........ 505/238; 505/100; 505/237; 505/473; 428/697; 428/698; 428/701; 427/251; 427/255.38; 427/593; 427/596; 427/62

(58) Field of Classification Search .................. 505/100, 505/235, 238, 473, 826; 428/704; 427/62, 427/255.38; 204/192.24
See application file for complete search history.

(56) References Cited

U.S. PATENT DOCUMENTS

| 6,773,836 B2 | 8/2004 | Kim et al. |
| 6,797,341 B2 | 9/2004 | Zeng et al. |
| 2002/0189533 A1* | 12/2002 | Kim et al. ................... 117/101 |

(Continued)

FOREIGN PATENT DOCUMENTS

| JP | 2002274841 A | 9/2002 |
| JP | 2003-063817 | * 3/2003 |
| JP | 200363817 A | 3/2003 |

(Continued)

OTHER PUBLICATIONS

Harada et al, "As-grown MgB2, Maku Usumaku no Cho Dendo Tokusei," 2004 Nen (Heisei 16 Nen) Shuki Dai 65 Kai Extended abstracts, The Japan Society of Applied Physics, 2004 Nen, 9 Gatsu, p. 186, 2P-A-10.*

(Continued)

*Primary Examiner* — Stanley Silverman
*Assistant Examiner* — Kallambella Vijayakumar
(74) *Attorney, Agent, or Firm* — Westerman, Hattori, Daniels & Adrian, LLP

(57) ABSTRACT

A magnesium boride thin film having a B-rich composition represented by the general formula of $MgB_x$ (x=1 to 10) and a superconducting transition temperature of 10K or more has superior crystallinity and orientation and is used as a superconducting material. This thin film is formed by maintaining a film forming environment in a high vacuum atmosphere of $4 \times 10^{-5}$ Pa or less, and simultaneously depositing Mg and B on a substrate maintained at a temperature of 200° C. or less so as to grow the film at a growth rate of 0.05 nm/sec or less. It is preferable to supply an Mg vapor and a B vapor into the film forming environment at an Mg/B molar ratio of 1/1 to 12/1.

4 Claims, 3 Drawing Sheets

U.S. PATENT DOCUMENTS

2003/0096711 A1* 5/2003 Saito et al. .................... 505/825
2003/0219911 A1* 11/2003 Zeng et al. ........................ 438/2

FOREIGN PATENT DOCUMENTS

| JP | 2003158307 A | | 5/2003 |
|---|---|---|---|
| JP | 2003158308 A | | 5/2003 |
| JP | 2004-099347 | * | 4/2004 |
| JP | 200499347 A | | 4/2004 |
| JP | 2004176174 A | | 6/2004 |

OTHER PUBLICATIONS

Harada et al; "Synthesis of as-grown superconducting MgB2 thin films by molecular beam epitaxy in UHV conditions," Physica C, 2004, V 412-414, pp. 1383-1386.*

Sakata et al, "High-quality as-grown MgB2 thin-film fabrication at a low temperature usning in-plane-larttice near-matched epitaxial-buffer layer," J. Applied Phys, 2004, 96(6), 3580-3582.*

Naitou et al, "MgB2 thin films for superconducting electronics," Superconduct. Sci. Tech 2004, 17, R1-R18.*

Yoshiyuki Harada et al., "As-grownMgB2 Maku Usumaku no Cho Dendo Tokusei", 2004 Nen (Helsei 16 Nen) Shuki Dai 65 Kai Extended abstracts; the Japan Society of Applied Physics Dai 1 Bunsatsu, The Japan Society of Applied Physics, 2004 Nen, 9 Gatsu, p. 186, 2p-A-10.

International Search Report of PCT/JP2006/306397, date of mailing Jun. 20, 2006.

* cited by examiner

SUPERCONDUCTING MAGNESIUM BORIDE THIN-FILM AND PROCESS FOR PRODUCING THE SAME

TECHNICAL FIELD

The present invention relates to a magnesium boride thin film and a manufacturing method thereof, the magnesium boride thin film having a high superconducting transition temperature, high crystallinity, superior uniformity, and superior flatness, and being able to be applied to a superconducting device including a Josephson junction and/or a multilayer structure which is essential for a next-generation device.

BACKGROUND ART

Since a magnesium diboride ($MgBr_2$) film has relatively high superconducting properties, such as a maximum transition temperature of 39K, among various intermetallic compounds, it is anticipated to be used as a functional material in various fields such as a superconducting magnet, a Josephson element, and a sensor, and fundamental research on physical properties of the magnesium diboride film has also been carried out. $MgB_2$ is superior to an oxide superconducting material in terms of stability and safety and is an intermetallic compound which can be easily handled.

In order to form a magnesium diboride film, as a method using high volatility of Mg, a method has been known in which a precursor film composed of boron or boron containing Mg is crystallized by firing at a high temperature in an Mg vapor atmosphere (JP2004-176174A, U.S. Pat. No. 6,773,836B). However, by the high temperature firing, the structural change caused by oxidation and/or re-evaporation of Mg cannot be avoided, and as a result, the formation of a superconducting device including a multilayer structure and/or a Josephson junction is adversely influenced.

As a method for eliminating defects caused by the structural change, there may be mentioned an as-grown film formation in which $MgB_2$ is grown by vapor co-deposition using an MBE method (JP2003-158308A, JP2004-99347A). However, in order to suppress the oxidation and/or the re-evaporation of Mg, an Mg flow rate must be increased. Furthermore, in order to increase the superconducting transition temperature and the crystallinity, although the temperature is low as compared to that of the firing, the substrate must be maintained at a high temperature during the formation as is the case in the past. In addition, in a method in which $H_2$, $N_2$, and the like are supplied in order to facilitate reaction between Mg and B (JP2004-99347A), it is difficult to obtain a high vacuum condition which is necessary to stabilize the crystallinity of a vapor deposition film.

In a conventional as-grown film formation, the degree of vacuum of film forming conditions is liable to decrease concomitant with an increase in flow rate of an Mg vapor. When the degree of vacuum decreases, adverse influences due to residual gases occur, and as a result, the crystallinity and the orientation of a magnesium diboride film may be degraded in some cases. In addition, in the vapor deposition performed on a substrate which is maintained at a high temperature, a diffusion reaction is facilitated at the interface between the substrate and the thin film, and the interface of the multilayer structural film, which is particularly necessary for device formation, cannot be made steep flat interface; hence, it is difficult to obtain a thin film which can satisfy the properties necessary for device formation. Furthermore, since there have not been sufficient knowledges of modification of a substrate surface for film formation and of conditions forming a B-rich film to improve the properties, it has been difficult to obtain a high-performance magnesium boride superconducting thin film having superior crystallinity.

In recent years, the use of an HPCVD method has also been proposed (U.S. Pat. No. 6,797,341B). Although the HPCVD method advantageously forms a thin film having high crystallinity, because of the limitation from a process point of view, the above method is not suitably used to form a multilayer structural film necessary for device formation.

DISCLOSURE OF INVENTION

Based on the findings obtained through the results of various researches and studies of influences of vapor deposition conditions on properties of magnesium boride thin films, the present invention aims to improve the crystallinity, the composition uniformity, the flatness, and the superconducting transition temperature of a magnesium boride thin film by using film forming conditions in which the film forming atmosphere is set to a low temperature under an ultra high vacuum and in which the flow rates of B and Mg are decreased as small as possible, and in addition, the present invention also aims to form a high-performance superconducting magnesium boride thin film on a substrate selected from various semiconductors, oxides, plastics, and the like by an MBE method.

The superconducting magnesium boride thin film of the present invention has a B-rich composition represented by the general formula of $MgB_x$ (x=1 to 10), and the superconducting transition temperature thereof is 10K or more. The superconducting magnesium boride thin film is provided on a substrate composed of a ceramic, a semiconductor, a metal, or a plastic directly or indirectly with a surface modification layer interposed therebetween. When the x value of the $MgB_x$ is adjusted to have a B-rich composition of an x value of 1 to 10, a superconducting thin film having a superconducting transition temperature of 10K or more can be formed. The composition of the thin film can be adjusted by controlling the flow rates of an Mg vapor and a B vapor.

While the film forming conditions are maintained in a high vacuum atmosphere of $4 \times 10^{-5}$ Pa (preferably $1 \times 10^{-7}$ Pa) or less, Mg and B are simultaneously vapor deposited by an MBE method on a substrate which is maintained at a low temperature of 200° C. or less, thereby forming the magnesium boride thin film. The Mg vapor and the B vapor are preferably supplied into the film forming conditions so as to obtain a flow rate of the B vapor in terms of the vapor deposition rate (hereinafter, the flow rate indicates the same as described above) of 0.05 nm/sec or less and an Mg/B molar ratio of 1/1 to 12/1.

The growth rate is set to an extremely slow rate of 0.05 nm/sec or less so as to increase the crystallinity and so as to form a B-rich vapor deposition film. In forming the film, when an initial layer of Mg or B, a 3d metal such as Ti or Zn, a group VB element such as Sb, Bi, or As, or an oxide such as MgO or ZnO is deposited, the substrate surface can be modified. Although a metal, a metal compound, a metal oxide, and the like have a function as a buffer layer, the Mg and B function as the initial layer, the 3d metal functions as an adjusting layer of surface energy in combination with an oxide substrate, and the group VB element can facilitate the film formation at room temperature or more, increase the transition temperature, and contribute to the improvement in crystallinity.

BEST MODE FOR CARRYING OUT THE INVENTION

Figure 1:
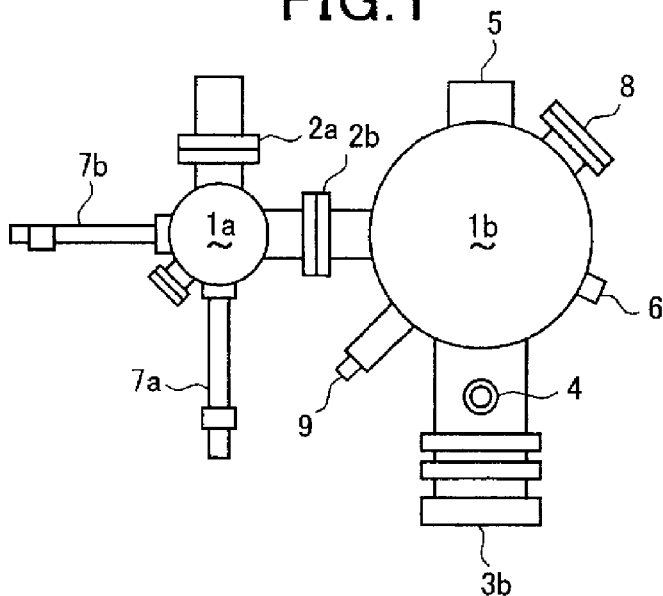
FIG. 1 is a schematic view of a molecular beam epitaxy apparatus.

For forming a magnesium boride thin film, a molecular beam epitaxy (MBE) apparatus schematically shown, for example, in FIG. 1 is used.

In this MBE apparatus, vacuum chambers, that is, a sample supply chamber 1a and a growth chamber 1b, are partitioned by gate valves 2a and 2b. The sample supply chamber 1a is an only region which is in contact with the air, and in order to obtain a high vacuum condition within a short period of time, a turbo molecular pump (not shown) having a large capacity relative to the inside volume of the supply chamber 1a is provided.

The growth chamber 1b is always maintained in an ultra high vacuum state by a turbo molecular pump 3b. In particular, in order to minimize influences of residual gases and the like, the growth chamber 1b is evacuated so that the degree of vacuum is higher by two orders of magnitude or more than that of a conventional vacuum vapor deposition apparatus. Furthermore, when a liquid nitrogen shroud is disposed so as to surround the growth chamber 1b, gas components in the atmosphere are trapped in the liquid nitrogen, and hence a high degree of vacuum is maintained during the vapor deposition. In addition, in order to remove light elements, such as hydrogen, which are difficult to be evacuated by the turbo molecular pump 3b, a titanium getter pump 4 is incorporated in the growth chamber 1b besides the turbo molecular pump 3b.

Under the growth chamber 1b, a Knudsen cell (K-cell) and an electron beam gun cell (EB-Gun-cell) are placed as evaporation sources although being not shown in the figure, and in accordance with properties of each evaporation material, the evaporation source is selected. Molecular beams from the evaporation source are directed to a substrate (not shown) which is disposed to face a manipulator 5. The substrate is surface-modified whenever necessary so that a B-rich thin film is formed by molecular beams emitted from the evaporation source.

Molecular beams of Mg and B form $MgB_x$ at the substrate surface and the vicinity thereof, and the $MgB_x$ is deposited on the substrate. The molecular beams of Mg and B can be measured by monitoring an evaporation rate using, for example, a quartz oscillation type film thickness meter 6. The manipulator 5 has a heating mechanism which can control a substrate temperature in the range of a target value ±0.5° C. during the vapor deposition.

A substrate for thin film vapor deposition is put in the sample supply chamber 1a by a transfer rod 7a and is then transferred to the growth chamber 1b by a transfer rod 7b. After the substrate is placed at a predetermined position in the growth chamber 1b, when Mg and B evaporated from the K-cell and the EB-gun-cell, respectively, are allowed to collide with each other on the substrate or in the vicinity thereof, the synthetic reaction of $MgB_x$ proceeds, so that a reaction product is deposited on the substrate. A reaction region during the vapor deposition is monitored by a RHEED fluorescent screen 8.

When the $MgB_2$ vapor deposition film is grown to a predetermined thickness, the evaporation of Mg and that of B are stopped, the substrate surface is then irradiated with electron beams emitted from an RHEED electron gun 9, and the diffraction beams are projected on the RHEED fluorescent screen 8, so that the surface condition of the $MgB_x$ vapor deposition film is observed. Subsequently, the substrate on which the $MgB_x$ vapor deposition film is grown is recovered from the growth chamber 1b by the transfer rod 7b into the sample supply chamber 1a.

When the $MgB_x$ vapor deposition film is deposited, the growth is controlled at a very slow rate, such as 0.05 nm/sec or less, by flow rate control of Mg and B vapors, so that a B-rich $MgB_x$ vapor deposition film is grown. A growth rate of 0.05 nm/sec or less can be achieved when the flow rate control of the Mg and the B vapors is performed so as to satisfy an Mg vapor flow rate of 0.6 nm/sec or less, a B vapor flow rate of 0.05 nm/sec or less, and an Mg/B molar ratio of 1/1 to 12/1. In particular, under the conditions in which the B vapor flow rate is set to 0.03 nm/sec as the basis and the Mg evaporation rate is set to 0.29 to 0.31 nm/sec, the Mg and the B vapors are generated and are then supplied into the reaction region.

In the film formation, the substrate is maintained at a low temperature of 200° C. or less to suppress re-evaporation of Mg as small as possible; however, the re-evaporation of Mg cannot be avoided. Under conditions in which the Mg vapor flow rate is larger than the B vapor flow rate, even when Mg and B are simultaneously deposited, the Mg concentration of the thin film is decreased in accordance with the re-evaporation of Mg. Since the composition of $MgB_x$ (x=1 to 10) is necessary for a high-quality superconducting thin film, in consideration of the re-evaporation of Mg, the Mg/B molar ratio between the Mg and the B vapors supplied into the reaction region is set in the range of 1/1 to 12/1.

The substrate at a temperature of 200° C. or less means that the $MgB_x$ vapor deposition film can be formed on a plastic substrate. In addition, since the flow rates of Mg and B vapors are decreased, residual gases may have adverse influences in some cases; however, when the film forming environment is maintained at a high vacuum atmospheric pressure of $4 \times 10$ Pa (preferably $1 \times 10^{-7}$ Pa) or less, the influences of residual gases can be ignored.

According to a conventional method for forming an $MgB_2$ vapor deposition film, since the melting point of Mg and B are extremely different from each other, a high growth temperature is necessary for the growth of a vapor deposition film under thermodynamic equilibrium conditions, and also in forming a thin film, it has been believed that a high-temperature environment is required. However, under the high-temperature environment, it may be concerned that in some cases, Mg having a low melting point and high volatile properties may re-evaporate. Hence, by increases in flow rate of Mg and B vapors, annealing in an Mg atmosphere, and the like, the generation and the growth of the $MgB_2$ vapor deposition film are facilitated so as to improve the crystallinity. As a result, for example, an increase in number of steps, counter diffusion between the substrate and other evaporation materials, and influences of residual gases, such as oxygen, hydrogen, and nitrogen, due to a high vapor pressure cannot be avoided.

Also in the as-grown film forming method known as a low-temperature film forming method, in order to form a film having a superconducting transition temperature of more than 30K, a temperature more than 200° C. is required. Furthermore, in order to prevent the oxidation of Mg, an increase in flow rate of an Mg vapor and an increase in film forming rate cannot be avoided, and as a result, the uniformity of the film and the surface flatness thereof, which are essential for forming devices, tend to be degraded.

On the other hand, according to the present invention, in order to grow a B-rich $MgB_x$ vapor deposition film while the composition uniformity and high surface flatness are both maintained, the flow rates of the Mg and the B vapors are adjusted to obtain a film forming rate of 0.05 nm/sec or less, which is extremely low as compared to that in the past. In addition, the temperature of the substrate is maintained at a low temperature of 200° C. or less during the film formation so as to suppress re-evaporation of Mg as small as possible, and the generation of crystal nuclei is facilitated by an increase in the degree of supersaturation. When the substrate temperature is set to 200° C. or less, it is also very significant by the following reasons. That is, the counter diffusion between the substrate material and other materials, which is a concern when a device having a multilayer structure or the like is formed, is suppressed; a high-quality film can be formed on various substrates, such as a plastic substrate; and a film having a multilayer structure can be formed by one operation step.

Figure 2:
FIG. 2 is a schematic cross-sectional view of an $MgB_x$ vapor deposition film provided on a substrate with a surface modification layer interposed therebetween.

Furthermore, prior to the formation of an $MgB_x$ vapor deposition film F, when a different type of thin film is deposited on a substrate S as a surface modification layer M (FIG. 2), the substrate surface can be modified, and as a result, the modification of the $MgB_x$ vapor deposition film provided on the substrate can be performed. In addition, a multilayer structure formed of the $MgB_x$ vapor deposition film and a functional thin film in combination therewith can also be available.

In the synthesis performed under a low-temperature environment, the degree of supersaturation is increased, and the generation of crystalline nuclei is facilitated. Concomitant with the growth facilitation of the crystalline nuclei, the crystallization of Mg having a low melting point is advanced, and hence the probability of decreasing the flow rate of the Mg vapor is expected. Although the decrease in flow rate of the Mg vapor is an idea against that of a conventional as-grown method, it is a very important issue in order to grow the $MgB_x$ vapor deposition film with good accuracy.

Concomitant with the decrease in flow rate of the Mg vapor, more serious influences of residual gases may be concerned as compared to those of the conventional method; however, since the film forming environment is placed in a higher vacuum state by two orders of magnitude or more, all the influences of residual gases can be substantially removed. Furthermore, as the film forming environment is placed in a higher vacuum state, an increase in ratio of Mg used for its re-evaporation may be concerned; however, since most of atoms which reach the substrate immediately lose its kinetic energy by the low temperature synthesis and then adsorb on the substrate, an $MgB_x$ vapor deposition film having high crystallinity can be grown while an effective consumption rate of Mg is not seriously decreased.

Among factors influencing the generation and the growth of the $MgB_x$ vapor deposition film and the surface flatness thereof, the growth rate is also important. When the growth rate decreases, the supersaturation phenomenon concomitant with a decrease in film forming temperature is cancelled, and as a result, the synthetic reaction of $MgB_x$ is facilitated. However, since the vapor deposition is performed by decreasing the flow rates of the Mg and the B vapors, when the entire substrate is considered in combination with the evaporation materials supplied in the form of molecular beams, variation in flow rate is likely to be reflected to the adhesion amount. The variation in adhesion amount means to grow a non-uniform $MgB_x$ vapor deposition film.

Through research on the relationship among the growth rate, the vapor flow rate, and the degree of supersaturation, it was found that as conditions forming an $MgB_x$ vapor deposition film having high crystallinity and superior flatness, it is significant to slightly rotate the substrate. The rotation of the substrate is also effective to homogenize the composition of the vapor deposition film, and even when the Mg/B molar ratio of the vapor flow rate is arbitrarily changed in the range of 1/1 to 12/1, an $MgB_x$ vapor deposition film having a uniform composition can be obtained. Above all, when the flow rates of the Mg and the B vapors are adjusted so that the Mg/B ratio is set in the range of 8/1 to 10/1, the superconducting properties can be improved. As described above, the conditions, that is, the low temperature, the low vapor deposition flow rate, the low growth rate, and the ultra high vacuum, are essential for synthesis of an $MgB_x$ vapor deposition film having superior crystallinity, properties, uniformity, and flatness.

Among the properties of the $MgB_x$ vapor deposition film, since it is used as a superconducting substance, the following three, that is, the superconducting transition temperature, the critical magnetic field, and the critical current, are important. In general, among superconducting substances formed from the same materials, as the crystallinity becomes high, the superconducting transition temperature is also increased. From the point described above, since the $MgB_x$ vapor deposition film formed in accordance with the present invention has superior uniformity and crystallinity, the superconducting transition temperature is high as compared to that of boride superconducting films reported in the past. Furthermore, improvements in crystallinity and uniformity significantly improve a superconducting volume fraction in the film, and by an increase in magnetic hysteresis and by suppression of magnetic field intrusion, the critical magnetic field and the critical current are significantly increased.

Although an oxide substrate is generally used for forming a superconducting thin film, by an oxide substrate such as MgO or $Al_2O_3$, it has been known that oxygen on the surface and the second layer of the substrate has a large influence on the thin film formation. In addition, in the $MgB_x$ vapor deposition film, although Mg and B both have high reactivity with oxygen, from the electronegativity point of view, a component which is likely to react with the surface of any oxide substrate is Mg. In the preferential growth of Mg, it may be concerned that since Mg which is likely to be bonded to oxygen is stabilized in the form of an oxide, the bonding force of the following B becomes weak.

Accordingly, in the case in which an oxide substrate is used, when the substrate surface is terminated by another metal, or the $MgB_2$ vapor deposition film is generated and grown under B preferential or B-rich conditions, the Mg-preferential vapor deposition reaction is suppressed, and as a result, an $MgB_2$ vapor deposition film having superior superconducting properties can be obtained. As a substance used to terminate the substrate surface, for example, an initial layer formed of only Mg or B; Mg—B having a slightly B-rich composition from an intended composition; a 3d metal, such as Ti, Zn, Cu, Cr, Zr, or Co, or a compound thereof; a group VB element, such as As, Bi, or Sb; or an oxide, such as MgO, ZnO, or $Al_2O_3$. A layer formed from a 3d metal or a compound thereof is non-magnetic or is non-magnetized by film forming conditions.

Although the $MgB_x$ vapor deposition film formed under the optimum conditions is thin, streak lines are a spot pattern observed by RHEED, and it is confirmed that the crystallite in the film is partly an in-plane polycrystalline film which is three dimensionally grown like a single crystal. According to the results of x-ray diffraction measurement, other than the substrate, only (001) and (002) peaks are present, and hence it shows that the C-axis of the $MgB_x$ is oriented in the direction perpendicular to the substrate surface to form the film. Furthermore, from the measurement results of the electrical resistivity and the magnetic susceptibility, the superconducting transition at a highest temperature of 37K is confirmed.

Since the $MgB_x$ vapor deposition film in accordance with the present invention is generated and grown at a low temperature, the interface diffusion is suppressed, and hence the $MgB_x$ vapor deposition film is suitably applied to multilayer formation with a metal and the like, which is expected for a next-generation device, and to formation of tunnel devices, such as a SQUID. Furthermore, a multilayer forming process can be performed by one process, and a high-quality device can be advantageously formed at a reasonable cost.

EXAMPLE 1

With reference to an example of forming an $MgB_2$ vapor deposition film using a single crystal MgO(100) substrate, the present invention will be described in more detail. The MgO (100) substrate has a feature in which a clean surface with high flatness can be obtained by a simple method.

The MgO(100) substrate which was processed to have a clean surface was set in the growth chamber 1b. While the growth chamber 1b was maintained in an ultra high vacuum atmosphere at a pressure of $4 \times 10^{-7}$ Pa or less, Mg and B were evaporated from a K-cell and an EB-Gun-cell, respectively, which were used as evaporation sources for Mg and B. While the generation of Mg and B vapors was always monitored by using the quartz oscillation type film thickness meter 6, the flow rates of the Mg vapor and the B vapor were adjusted so as not to generate the variation thereof.

Although the Mg supplied to the substrate surface is lost at a high ratio due to diffusion and re-evaporation, when Mg once reaches the substrate, Mg atoms brought into contact with the substrate surface at a low temperature immediately lose their energy and adsorb thereon. Because of the electronegativity relationship with B, which simultaneously adsorbs together with Mg, Mg and B react with each other and are deposited on the substrate in the form of $MgB_x$.

Figure 3:
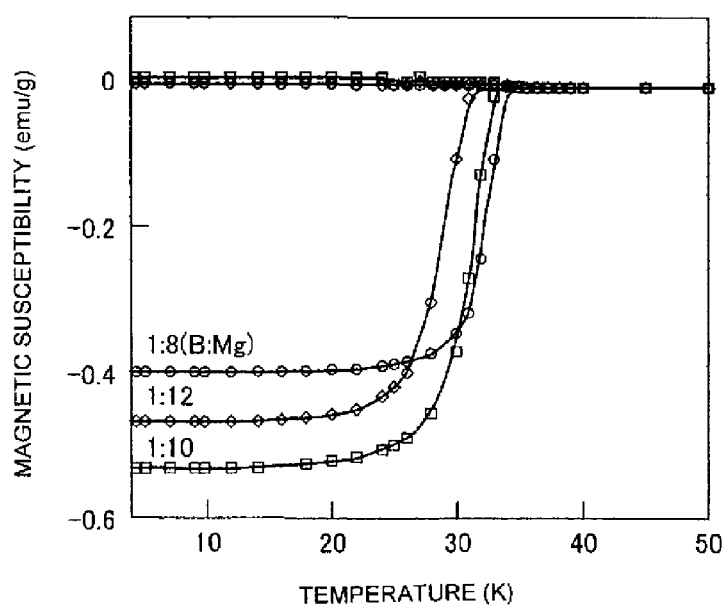
FIG. 3 is a graph showing the temperature dependence of magnetization curves of $MgB_x$ vapor deposition films.

By adjusting the flow rates of the Mg and the B vapors, the influences of a composition ratio between Mg and B on the film forming properties and the film properties were investigated. The substrate temperature and the vapor deposition rate of B were set to 200° C. and 0.03 nm/sec, respectively, and the ratio of the Mg vapor to the B vapor (hereinafter referred to as "Mg/B molar ratio") was changed from 2/1 to 12/1. The results of magnetization measurement of an $MgB_x$ vapor deposition film formed at an Mg/B molar ratio of 8/1 to 12/1 are shown in FIG. 3. In addition, the relationship between the Mg/B molar ratio and the x value of the $MgB_x$ vapor deposition film is shown in Table 1.

TABLE 1

Influence of Flow Rate Ratio of Mg to B Vapors to Composition of $MgB_x$ Vapor Deposition Film

| | Mg/B molar ratio of supplied vapors | | | | |
|---|---|---|---|---|---|
| | 2 | 4 | 8 | 10 | 12 |
| X value of $MgB_x$ | 9~10 | 8~9 | 4~6 | 1~3 | 1 |

It was understood from FIG. 3 that the superconducting transition temperature of an $MgB_x$ vapor deposition film, which was formed by simultaneously depositing Mg and B using an Mg vapor and a B vapor at an Mg/B molar ratio of 8/1, was highest, and that the transition width was also sharp. As the Mg/B molar ratio was increased to more than 8, the transition temperature gradually decreased and also tended to decrease even when it was less than 8.

The results described above indicates that by changing the flow rates of the Mg vapor and the B vapor, an arbitrary superconducting $MgB_x$ (x=1 to 10) film can be obtained, and that the film properties are considerably influenced by the flow rate ratio of the Mg and the B vapors, that is, in other words, by the composition ratio between Mg and B. In addition, it is also understood that when the Mg/B molar ratio is in the range of 8 to 10 (corresponding to an x value of 1 to 6), most preferable superconducting properties can be obtained.

Figure 4:
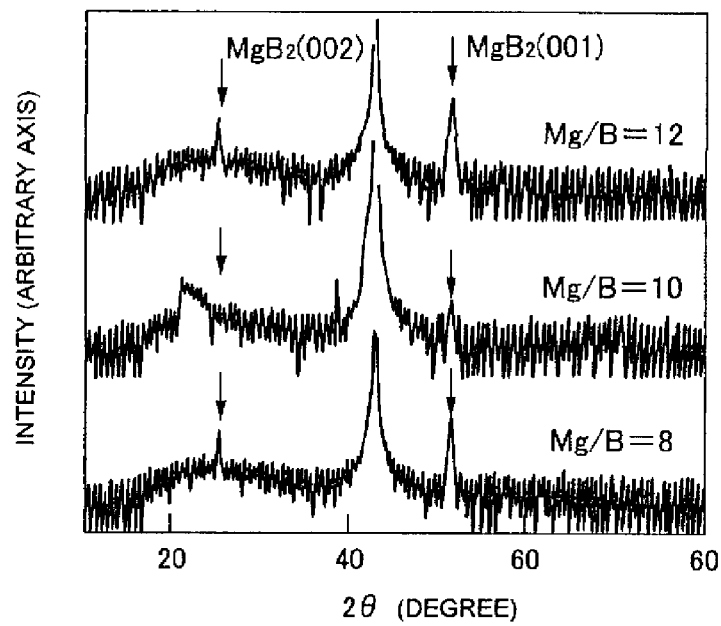
FIG. 4 is a graph showing x-ray diffraction spectra of $MgB_x$ vapor deposition films.
Figure 5:
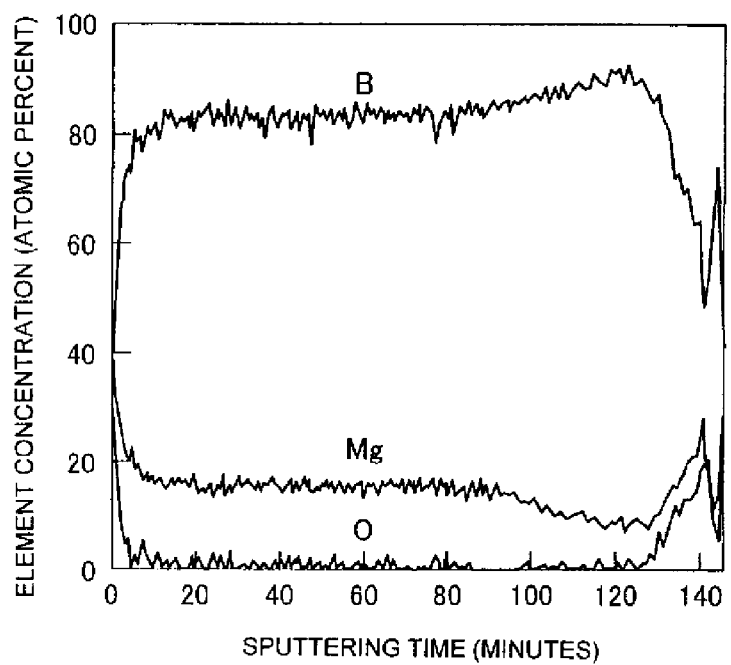
FIG. 5 is a graph showing element distributions of an $MgB_x$ vapor deposition film along the film thickness direction, the vapor deposition film being formed at a substrate temperature of 200° C. or less, a B vapor deposition rate of 0.03 nm/sec, and an Mg/B molar ratio of 8, which is obtained from flow rates of an Mg and a B vapor.
Figure 6:
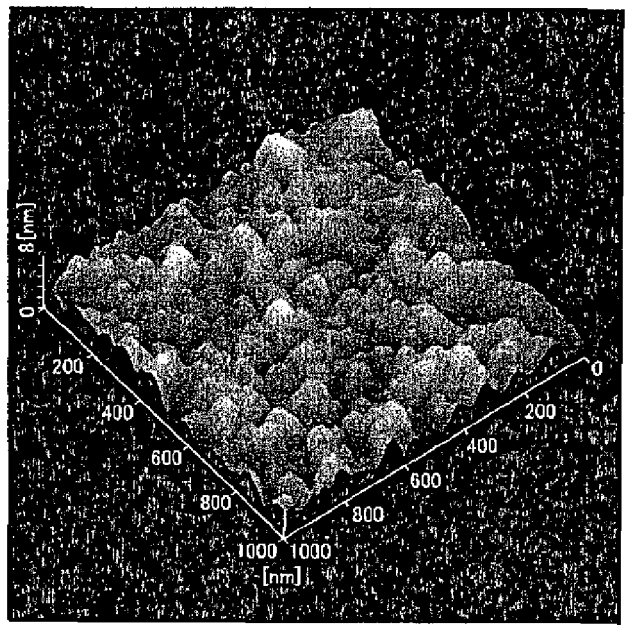
FIG. 6 is a photograph of an AMF image of an $MgB_x$ vapor deposition film.

Next, x-ray diffraction was performed for the $MgB_x$ vapor deposition film thus formed. By the diffraction results shown in FIG. 4, it was understood that since sharp peaks caused by the $MgB_2$(001) and the $MgB_2$(002) were detected, an $MgB_x$ vapor deposition film was formed in which the C-axis was oriented in a direction perpendicular to the film surface. In addition, when an XPS analysis was performed for a sample formed at an Mg/B molar ratio of 8 in order to investigate the concentration distribution along the film thickness direction, it was found that the sample was a B-rich vapor deposition film in which Mg and B were uniformly distributed as shown in FIG. 5. Furthermore, as shown in FIG. 6 indicating the flatness of a film measured by an AFM, an RMS roughness of the $MgB_x$ vapor deposition film was 1 nm or less, and it can be said that the flatness thereof is extremely high as compared to that of any other thin films reported in the past. From the measurement results described above, it can be said that the film thus obtained is an $MgB_x$ vapor deposition film having properties essential for forming a superconducting device including a multilayer film and a Josephson junction.

EXAMPLE 2

In this example, the influence of selection of an underlayer including a substrate material on the film properties was investigated.

$MgB_x$ (x=4 to 6) vapor deposition films were deposited under the same condition as that in Example 1 on substrates made of silicon: Si(111) having an interface shape similar to that of an $MgB_x$ vapor deposition film, sapphire: $Al_2O_3$, and zinc oxide: ZnO having a high matching crystalline structure. In addition, on substrates made of a stainless steel sheet (typical example of a metal substrate), a glass sheet, and a polyimide film, $MgB_x$ vapor deposition films were deposited under the same condition as that in Example 1.

Furthermore, on $Al_2O_3$ plates covered with Ti, MgO, and B, MgO plates covered with Cu, MgO, and B, and an $SrTiO_3$ plate covered with B, which were each used as a substrate provided with a surface modification layer thereon, $MgB_x$ vapor deposition films were deposited under the same condition as described above.

Figure 7:
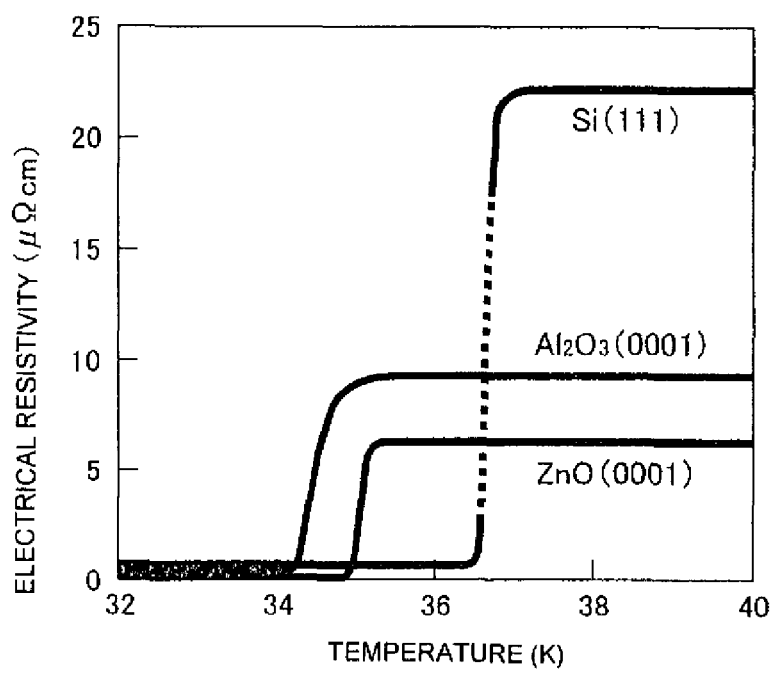
FIG. 7 is a graph showing the temperature dependence of $MgB_x$ vapor deposition films formed on various types of substrates.

The electrical resistivity of the film formed as described above was measured. As apparent from Table 2 showing part of the measurement results, the maximum superconducting transition temperature of the MgO(100) substrate was 35K, and all the other thin films also showed a high superconducting transition temperature. In particular, when the Si(111) substrate was used, the superconducting transition temperature of the $MgB_x$ vapor deposition film was increased to 37K which was equivalent to that of a bulk material. This superconducting transition temperature was the highest superconducting transition temperature among those of the as-grown methods as compared to that of a conventional method (FIG. 7).

TABLE 2

Relationship among Material of Substrate, Surface Modification Layer, and Superconducting Transition Temperature of $MgB_x$ Vapor Deposition Film

| Type of Substrate | Superconducting Transition Temperature | Type of Substrate | Surface Modification Layer | Superconducting Transition Temperature |
|---|---|---|---|---|
| MgO (100) | 35~29 | MgO | MgO | 36~35 |
| Si (111) | 37~36 | MgO | Cu | 35 |
| $Al_2O_3$ | 35~28 | $Al_2O_3$ | B | 35 |
| ZnO | 36~33 | $SrTiO_3$ | B | 36 |
| | | ZnO | Ti | 37~36 |

Heretofore, the present invention was particularly described with reference to the examples in which the polycrystalline or the amorphous $MgB_x$ vapor deposition films were deposited on the substrates, and synthesis of a single crystalline $MgB_x$ vapor deposition film by simultaneous vapor deposition without annealing is also included in the present invention. As for the substrate, besides MgO(100), $Al_2O_3$(0001), Si(111), and ZnO(0001), an $MgB_x$ vapor deposition film can also be formed on a substrate formed from an organic substance such as a plastic.

Even when a common substrate is used, the reaction can be controlled since synthesis is performed at a low-temperature atmosphere, and the substrate can be covered with a 3d metal, such as Ti or Zn, a Group VS element, such as Bi or As, or an oxide, such as MgO or ZnO, which is used as a surface modification layer. In addition, by forming an initial layer composed of only Mg or B or by forming a B-rich MgB layer containing B slightly higher than that of an intended composition, the substrate surface can be modified so as to facilitate the film formation of an $MgB_x$ vapor deposition film.

INDUSTRIAL APPLICABILITY

As has thus been described, by simultaneously depositing Mg and B on a substrate maintained at a low temperature in a high vacuum atmosphere, a superconducting magnesium boride thin film can be synthesized without performing annealing. Since a low temperature film formation at a temperature of 200° C. or less is performed, the atmosphere and the growth rate can be easily adjusted, and an $MgB_x$ vapor deposition film having an arbitrary composition can be formed. Since the reactivity can be controlled, the dependence on an underlayer material and an upper vapor deposition material is reduced, and the manufacturing of a superconducting device and a superconducting integrated circuit, including a multilayer structure and a Josephson junction, can be significantly advanced.

The invention claimed is:

1. A method for manufacturing a superconducting magnesium boride thin film, comprising the steps of:
    forming on a substrate as the surface modification layer at least one of vapor deposition films containing one or more selected from a 3d metal element selected from Ti, Zn, Cu, Cr, Zr, and Co, compounds of the metals; an oxide selected from MgO, ZnO, and $Al_2O_3$; a Group VB element selected from As, Bi, and Sb, Mg, and B;
    maintaining the substrate at a temperature of 200° C. or less in a molecular beam epitaxy apparatus of an ultra high vacuum atmosphere of $4\times10^{-5}$ Pa or less;
    simultaneously depositing Mg and B supplying an Mg vapor and a B vapor to the substrate under conditions in which
    the flow rate of the B vapor is set to 0.05 nm/sec or less in terms of a vapor deposition rate; and
    an Mg/B molar ratio is selected in a range of 1/1 to 12/1, wherein an $MgB_x$ vapor deposition film having a super conducting transition $MgB_x$, wherein x is determined by Mg/B molar ratio in the range of 1 to 10 or less on the surface modification layer provided therebetween.

2. The manufacturing method according to claim 1, wherein the $MgB_x$ vapor deposition film is simultaneously deposited by directing molecular beams from an Mg evaporation source and a B evaporation source toward the substrate while the substrate is rotated.

3. The manufacturing method according to claim 1, wherein the substrate is selected from:
    an oxide substrate selected from ZnO, MgO, $Al_2O_3$, or $SrTiO_3$;
    a semiconductor substrate selected from Si, GaAs, Ge or SiC;
    a metal substrate selected from stainless steel, copper, copper alloy, aluminum, or aluminum alloy; or
    a polyimide substrate.

4. The manufacturing method according to claim 1, wherein the Mg/B molar ratio is 8/1, and $MgB_x$ vapor deposition film having a composition represented by $MgB_x$, wherein x is 4 to 6 is grown.

* * * * *